(12) United States Patent
Morita

(10) Patent No.: US 11,221,352 B2
(45) Date of Patent: Jan. 11, 2022

(54) MAGNETIC-BALANCE-SYSTEM CURRENT SENSOR

(71) Applicant: TAMURA CORPORATION, Tokyo (JP)

(72) Inventor: Kiyotaka Morita, Saitama (JP)

(73) Assignee: TAMURA CORPORATION, Tokyo (JP)

(*) Notice: Subject to any disclaimer, the term of this patent is extended or adjusted under 35 U.S.C. 154(b) by 135 days.

(21) Appl. No.: 16/538,598

(22) Filed: Aug. 12, 2019

(65) Prior Publication Data

US 2020/0072875 A1     Mar. 5, 2020

(30) Foreign Application Priority Data

Aug. 31, 2018 (JP) .............................. JP2018-162461

(51) Int. Cl.

| G01R 15/18 | (2006.01) |
|---|---|
| H01F 27/24 | (2006.01) |
| G01R 19/00 | (2006.01) |
| H01F 27/28 | (2006.01) |

(52) U.S. Cl.
CPC ....... *G01R 15/183* (2013.01); *G01R 19/0092* (2013.01); *H01F 27/24* (2013.01); *H01F 27/28* (2013.01)

(58) Field of Classification Search
None
See application file for complete search history.

(56) References Cited

U.S. PATENT DOCUMENTS

| 9,234,918 B2 | 1/2016 | Schaerrer |
| 2017/0343585 A1* | 11/2017 | Harano ............... G01R 15/183 |

FOREIGN PATENT DOCUMENTS

| EP | 2431751 A1 | 3/2012 |
|---|---|---|
| EP | 2515124 A2 | 10/2012 |
| JP | 2014228418 A | 12/2014 |
| JP | 2015206596 A | 11/2015 |
| JP | 2016114585 A | 6/2016 |
| JP | 2016125863 A | 7/2016 |

OTHER PUBLICATIONS

Machine English Translation of JP2015-206596 to Harano (Year: 2014).*
Machine English Translation of JP2016-125863 to Kudo (Year: 2014).*

(Continued)

*Primary Examiner* — Douglas X Rodriguez
(74) *Attorney, Agent, or Firm* — Holtz, Holtz & Volek PC

(57) ABSTRACT

A current sensor 100 includes: a magnetic core 104 which focuses a magnetic field generated by continuity of a current to be sensed IP; an element 108 which outputs a sensing signal according to an intensity of the magnetic field focused by the magnetic core 104; a circuit 116 which applies a feedback current to a winding 118 based on the sensing signal from the element 108 and balances magnetism; and a coupling circuit 124 which couples supply paths 123, 124 of a power supply 122 to the circuit 116 and an application path 117 of a feedback current to the winding 118 via capacitors C1, C2.

4 Claims, 5 Drawing Sheets

(56) References Cited

OTHER PUBLICATIONS

Japanese Office Action (and English language translation thereof) dated Aug. 18, 2020 issued in counterpart Japanese Application No. 2018-162461.
Extended European Search Report (EESR) dated Jan. 22, 2020 issued in counterpart European Patent Application No. 19191093.4.
Dyuti, et al., "Power consumption reduction in high current closed loop Hall Effect current sensors using Class D Amplifier", 2016 IEEE International Conference on Power Electronics, Drives and Energy Systems (PEDES), IEEE, Dec. 14, 2016, pp. 1-6.

* cited by examiner

MAGNETIC-BALANCE-SYSTEM CURRENT SENSOR

BACKGROUND OF THE INVENTION

Field of the Invention

The present invention relates to a current sensor, and in particular to a magnetic-balance-system current sensor.

Description of the Related Art

A magnetic-balance-system current sensor obtains an output signal by generating a magnetic field in the opposite direction in a feedback coil provided around a magnetic core, and using a feedback current of a magnitude which cancels a magnetic field generated by continuity of a current to be sensed. Further, this type of current sensor includes a digital amplifier which amplifies a sensing signal from a magnetic sensing element, and combinedly uses an output filter provided in the digital amplifier with the feedback coil.

SUMMARY OF THE INVENTION

The present invention disclosed and claimed herein, in one aspect thereof, comprises a current sensor. The sensor comprises: a magnetic core which focuses a magnetic field generated by continuity of a current to be sensed; a magnetic sensing element which outputs a sensing signal according to an intensity of the magnetic field focused by the magnetic core; a magnetic balance circuit which applies a feedback current to a winding provided around the magnetic core based on the sensing signal from the magnetic sensing element and generates a magnet field in an opposite direction to the magnetic field generated by continuity of the current to be sensed to balance each other; and a coupling circuit which couples supply paths of a power supply to the magnetic balance circuit and an application path of a feedback current to the winding via capacitors.

Further scope of applicability of the present invention will become apparent from the detailed description given hereinafter. The detailed description and embodiments are only given as examples though showing preferred embodiments of the present invention, and therefore, from the contents of the following detailed description, changes and modifications of various kinds within the spirits and scope of the invention will become apparent to those skilled in the art.

BRIEF DESCRIPTION OF THE DRAWINGS

The present invention will be fully understood from the following detailed description and the accompanying drawings. The accompanying drawings only show examples and are not intended to restrict the present invention. In the accompanying drawings.

DETAILED DESCRIPTION

Figure 1:
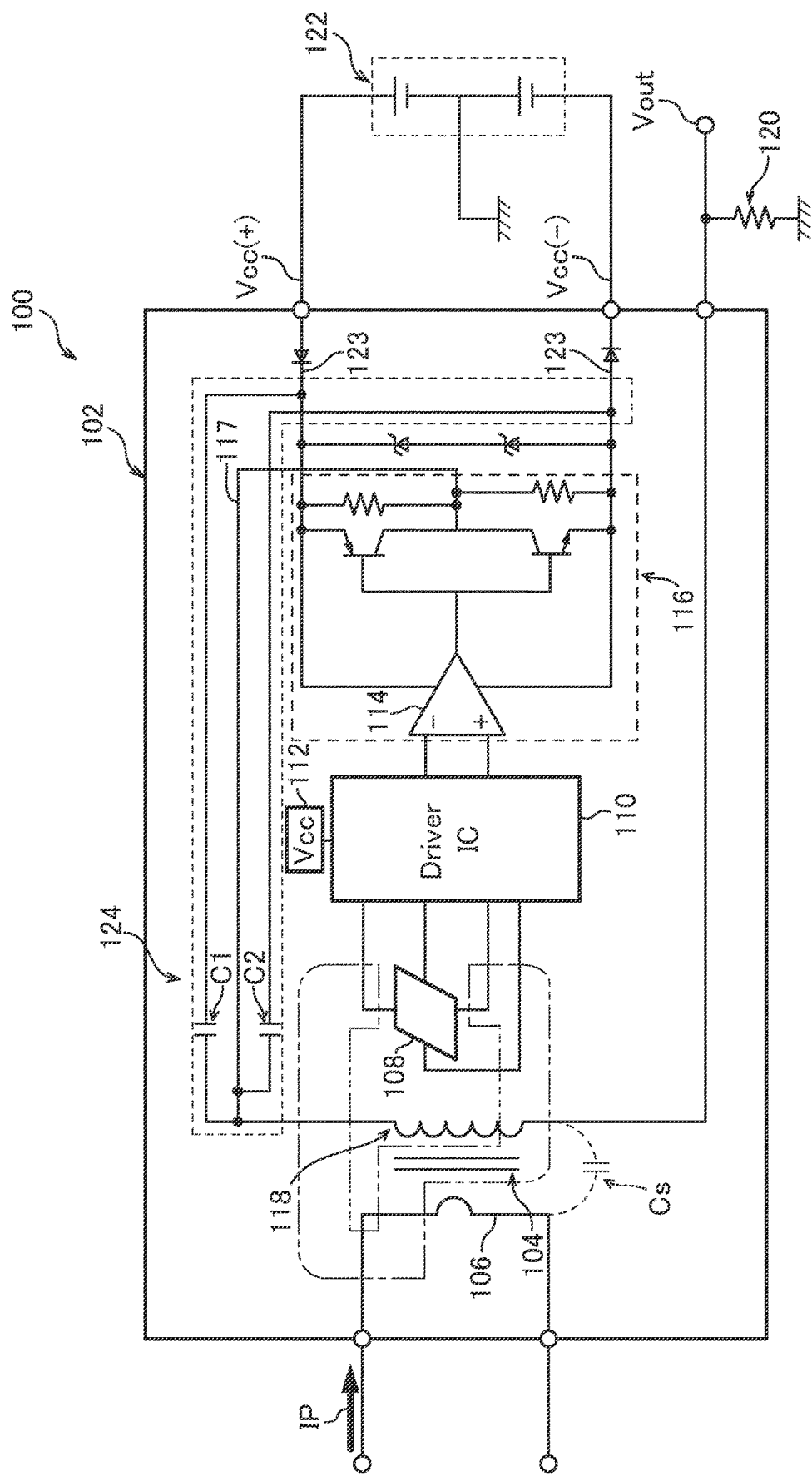
FIG. 1 is a circuit diagram of a current sensor of one embodiment.

Hereinafter, an embodiment will be described with reference to the drawings. FIG. 1 is a circuit diagram of a current sensor 100 of one embodiment.

The current sensor 100 includes, for example, a resin case 102, and a magnetic core 104 is housed in this resin case 102. Though FIG. 1 schematically illustrates the magnetic core 104 by using a two-dot chain line, the magnetic core 104 is preferably formed in a square ring shape, a circular ring shape, or the like, and a space for conducting current, what is called, a current-conducting portion is formed in the inside thereof (the inner periphery of the ring). Accordingly, a primary conductor 106 such as a bus bar passes through and is disposed in the inside of this current-conducting portion. Note that a current to be sensed IP is conducted through the primary conductor 106.

Thus, the current sensor 100 targets the current passing through the primary conductor 106 for sensing, and the magnetic core 104 is annularly disposed along a circumferential direction of a magnetic field to be generated when the current to be sensed IP flows through the primary conductor 106. Note that when the current to be sensed IP is at a relatively low level (weak current), the primary conductor 106 may be wound around the magnetic core 104.

[Magnetic Sensing Element]

The current sensor 100 includes a Hall element 108 (a MR element or a MI element is also applicable) as one example of an element for magnetic sensing. The magnetic core 104 is formed in a ring shape as described above, and the middle portion thereof is partially cut out, thereby forming an air gap. The Hall element 108 is mounted in the magnetic core 104 in a state of inserting it into the air gap. The Hall element 108 outputs a voltage signal (Hall voltage) according to an intensity of a magnetic field (magnetic flux) generated in the air gap.

[Dedicated Circuit]

Further, the current sensor 100 includes a driver IC 110. This driver IC 110 is, for example, an electronic component (discrete product) whose configuration is optimized for such a servo-type current sensor 100 as described in this embodiment and inside which a dedicated designed circuit is packaged. To the driver IC 110, a driving voltage (for example, +5 V) is supplied from a power supply circuit (Vcc) 112, and besides, a voltage signal outputted from the Hall element 108 is inputted. Further, the driver IC 110 distributes and supplies drive power to the Hall element 108, and changes its polarity.

As mentioned above, the current sensor 100 of this embodiment is a servo type, and therefore includes components as a feedback circuit 116 (magnetic balance circuit). The feedback circuit 116 has, for example, a differential amplifier 114 connected to the above-described driver IC 110, and besides has switching elements (whose reference signs are omitted in the diagram) and a secondary winding 118 wound around the magnetic core 104. Though schematically illustrated in FIG. 1, the secondary winding 118 is formed, for example, in a state of being wound around an outer periphery of the magnetic core 104. The feedback circuit 116 drives the switching elements based on the voltage signal from the Hall element 108, and generates a feedback current to be applied to the secondary winding 118. The feedback current is applied through an application path 117 to the secondary winding 118. The secondary winding 118 generates an opposing magnetic field in a direction in which the magnetic field generated by the current to be sensed IP is canceled and balances internal magnetic fields of the magnetic core 104 by the feedback current being applied (supplied) thereto.

The current sensor 100 outputs the feedback current of the secondary winding 118 to an external portion. An output current is converted to an output voltage Vout by, for example, an external sensing resistor 120. Note that the sensing resistor 120 may be built in the current sensor 100.

The current sensor 100 can be operated by connecting it to, for example, an external direct-current power supply 122. A power supply is supplied from the direct-current power supply 122 through supply paths 123 to the feedback circuit 116. The direct-current power supply 122 becomes supply sources (Vcc (+) and Vcc (−)) of the feedback current to be generated by the above-described feedback circuit 116. Further, a voltage is, for example, ±24 V in the direct-current power supply 122. Note that the direct-current power supply 122 may be built in the current sensor 100.

In addition, various circuit elements or protective elements (resistors, diodes, Zener diodes, and the like) are built in the current sensor 100 besides the above, but descriptions of these are omitted.

Here, the current sensor 100 of this embodiment includes a coupling circuit 124. The coupling circuit 124 includes two capacitors C1, C2, and couples the secondary winding 118 via these capacitors C1, C2 with the supply paths 123 of the power supply from the direct-current power supply 122 to the feedback circuit 116. In the capacitors C1, C2, one capacitor C1 is connected to the supply path 123 on a positive (Vcc (+24 V)) side of the direct-current power supply 122 and the other capacitor C2 is connected to the supply path 123 on a negative (Vcc (−24 V)) side thereof respectively. Such a coupling circuit 124 can be achieved by mounting, for example, chip-type capacitors as the capacitors C1, C2 on an unillustrated circuit board, and can significantly reduce manufacturing costs including production of a wiring pattern.

In the structure of the current sensor 100, by sealing the inside of the resin case 102 with a filler made of resin (for example, PU or the like), a parasitic capacitance Cs (stray capacitance) is present between the primary conductor 106 and the secondary winding 118 with the filler being a dielectric. The inventor of the present invention has made it clear that this parasitic capacitance Cs acts in a direction in which the primary conductor 106 and the secondary winding 118 are subjected to capacitive coupling, and therefore, for example, when a steep change (high-speed switching) occurs in the current to be sensed IP, a high-frequency component at that time is transferred as noise to the secondary winding 118, resulting in having an adverse effect on the output voltage Vout.

The inventor's proper measures against the above are achieved by providing the above-described coupling circuit 124 in the current sensor 100. That is, by coupling the secondary winding 118 through the capacitors C1, C2 with the supply paths 123 (±) of the power supply from the direct-current power supply 122 to the feedback circuit 116, the coupling circuit 124 can make a problematic noise component escape actively to places different from the secondary winding 118. This makes it possible to prevent occurrence of the adverse effect on the output voltage Vout and highly maintain quality and accuracy of a sensing signal obtained in the current sensor 100.

The availability according to the current sensor 100 of this embodiment becomes further clear by the contrast to two comparative examples cited below. Note that the comparative examples are not embodiments but related arts, and are not conventional arts.

Figure 2:
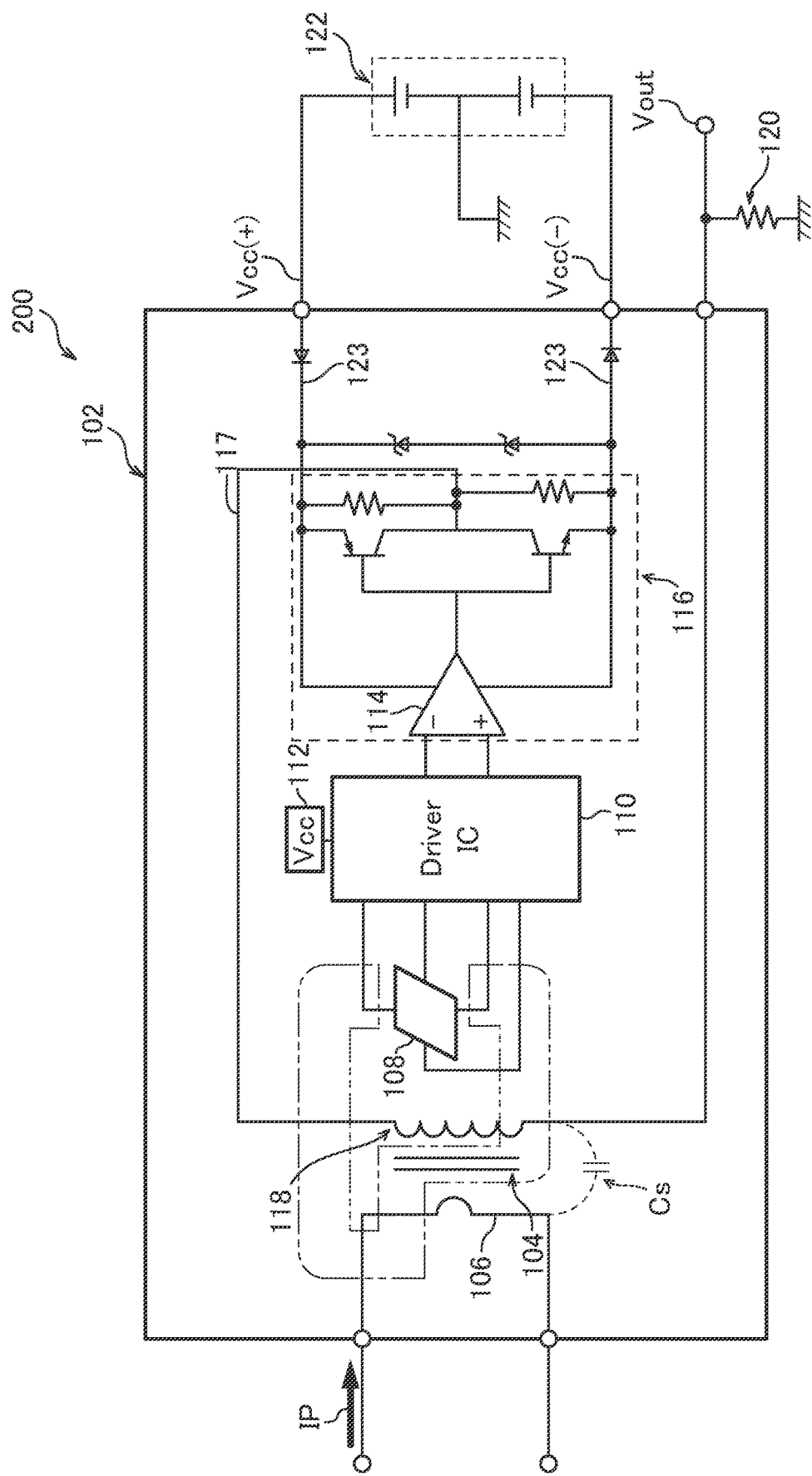
FIG. 2 is a circuit diagram of a current sensor of a first comparative example.

FIG. 2 is a circuit diagram of a current sensor 200 of a first comparative example. The current sensor 200 of the first comparative example is significantly different in that a configuration of the coupling circuit 124 used in this embodiment is not included. The other components common to those of this embodiment are denoted by common reference signs in FIG. 2, and their redundant descriptions are omitted.

No measures against a parasitic capacitance Cs are particularly provided for the current sensor 200 of the first comparative example. Accordingly, the above-described problem made clear by the inventor remarkably appears, and an output voltage Vout is significantly adversely affected by a noise component. Note that this point is further described later by citing a specific verification result.

Figure 3:
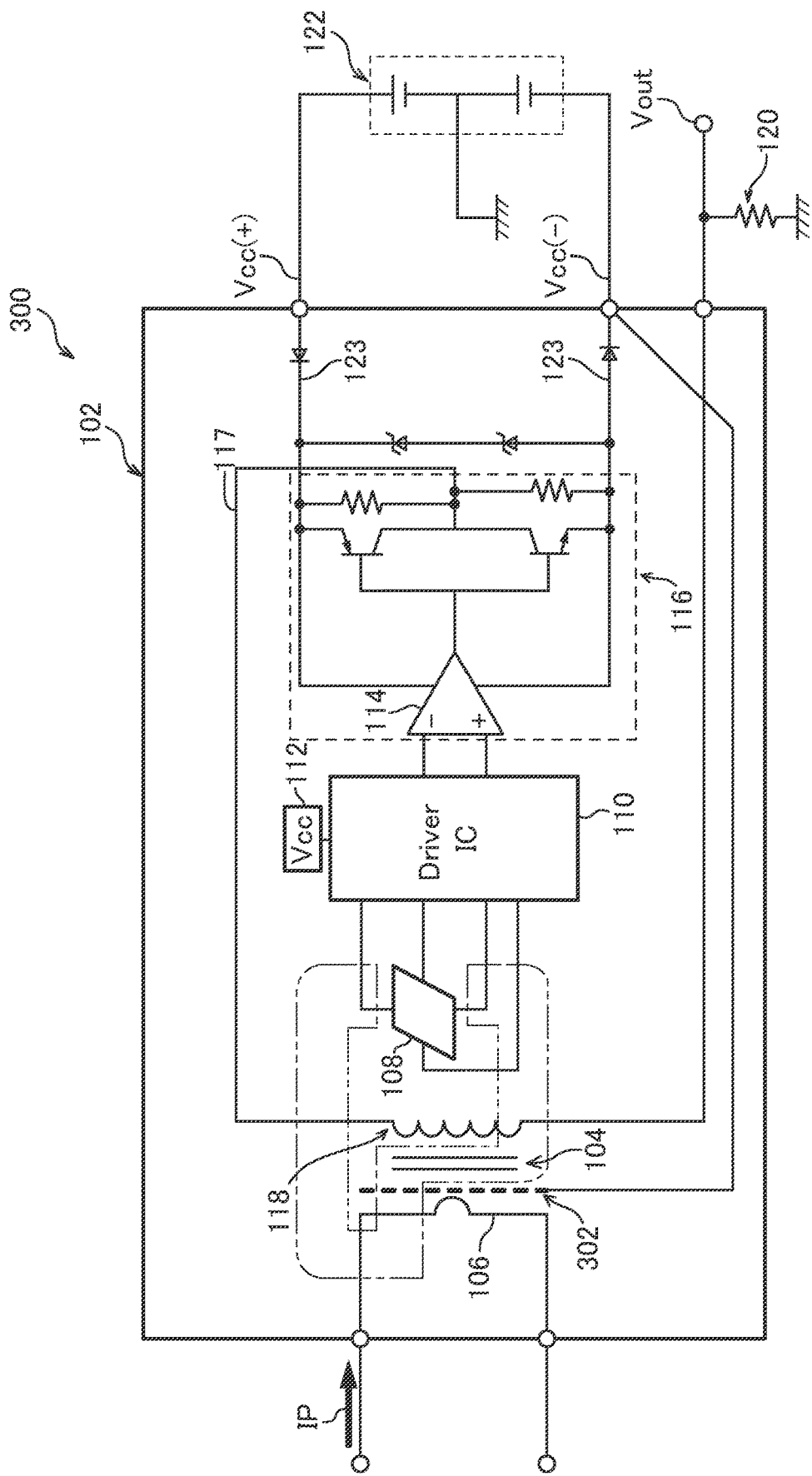
FIG. 3 is a circuit diagram of a current sensor of a second comparative example.

FIG. 3 is a circuit diagram of a current sensor 300 of a second comparative example. In the second comparative example, a physical shielding material 302 (for example, a copper plate) is interposed between a primary conductor 106 and a secondary winding 118, and the shielding material 302 is grounded on a negative side of a direct-current power supply 122. In this case, though a parasitic capacitance is theoretically considered not to be generated, sufficient measures are not realistically taken yet. Note that this point is also further described later by citing a specific verification result.

Figure 4:
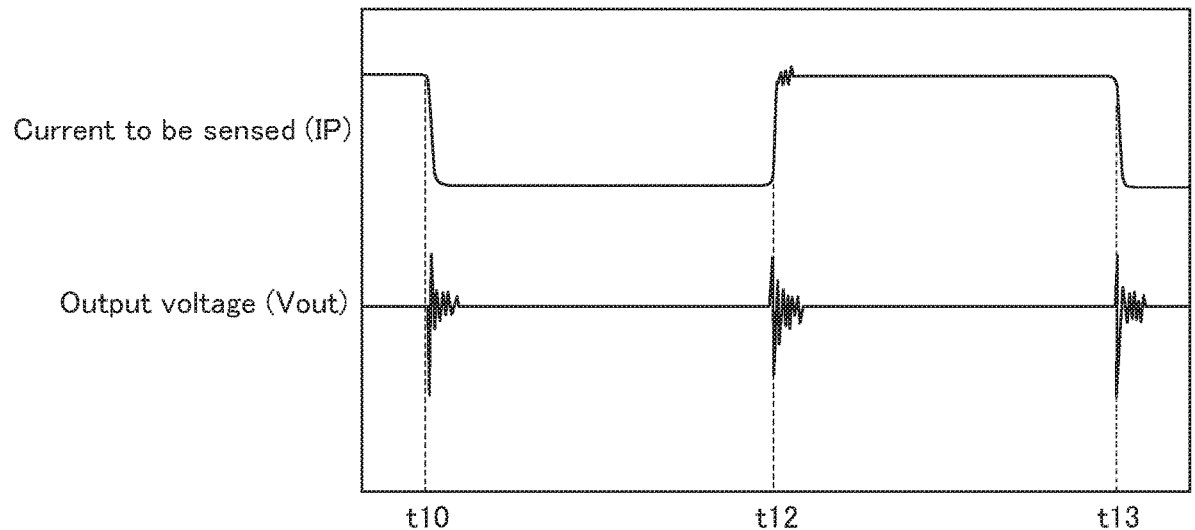
FIG. 4 is a graph representing a characteristic of the current sensor of the first comparative example.
Figure 5:
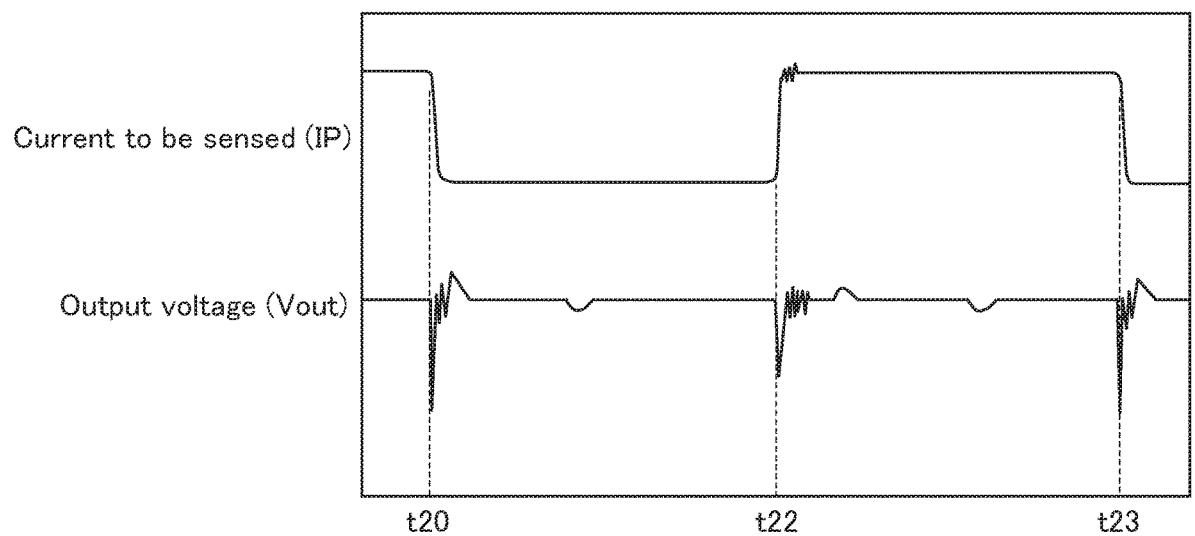
FIG. 5 is a graph representing a characteristic of the current sensor of the second comparative example.
Figure 6:
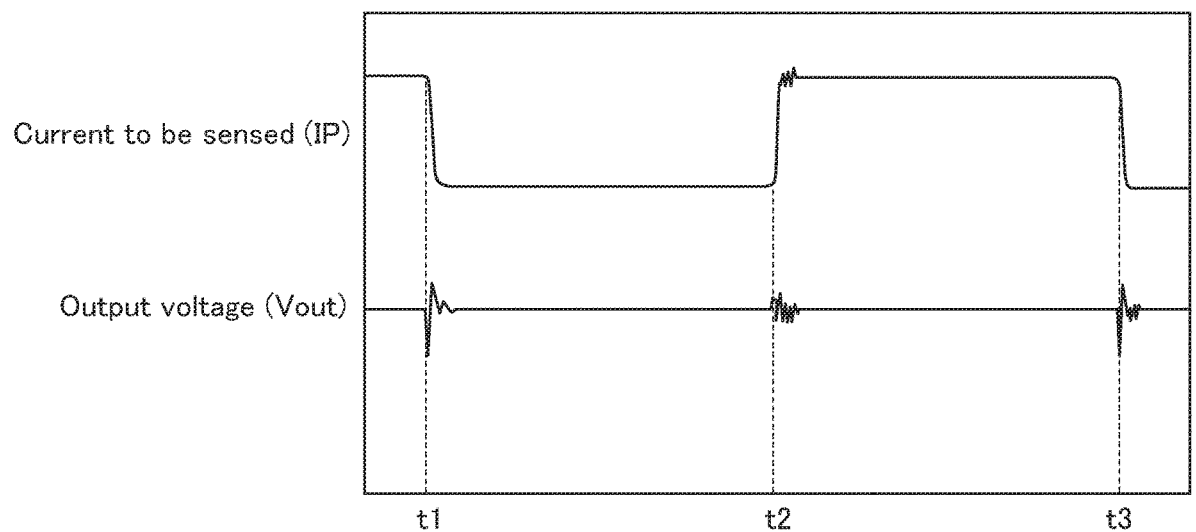
FIG. 6 is a graph representing a characteristic of the current sensor of one embodiment.

FIG. 4 is a graph representing a characteristic of the current sensor 200 of the first comparative example, FIG. 5 is a graph representing a characteristic of the current sensor 300 of the second comparative example, and FIG. 6 is a graph representing a characteristic of each current sensor 100 of this embodiment. Hereinafter, the respective characteristics will be described.

FIG. 4: Characteristic of First Comparative Example

An input waveform of a current to be sensed IP is represented in the upper section. Here, for example, at three times t10, t12, t13, high-speed switchings (all of which are steep changes) occur in the current to be sensed IP.

As a result, in the first comparative example in which no measures are taken, it is found that a high-frequency component of the current to be sensed IP becomes the noise component with respect to a feedback current through the parasitic capacitance Cs between a primary conductor 106 and a secondary winding 118, and has an extreme adverse effect on the output voltage Vout represented in the lower section (times t10, t12, t13).

FIG. 5: Characteristic of Second Comparative Example

When the upper section is seen, also here, similarly, for example, at three times t20, t22, t23, high-speed switchings (all of which are steep changes) occur in a current to be sensed IP.

When the lower section is seen, in the second comparative example, despite theoretically taking measures by disposing the shielding material 302, in performing verification actually, it is found that an adverse effect of a noise component on an output voltage Vout cannot be sufficiently removed. For example, though a disturbance of a waveform in a positive direction of the output voltage Vout is suppressed at each of the times t20, t22, t23, a disturbance in a negative direction is not suppressed. In addition, the disturbance appears in the output voltage Vout even in a later time zone than the respective times t20, t22, t23 (a later time than the time t23 does not appear in the graph), which causes a counter result on the contrary.

FIG. 6: Characteristic of this Embodiment

As can be seen in the upper section, also in this embodiment, for example, at three times t1, t2, t3, high-speed switchings (all of which are steep changes) occur in the current to be sensed IP.

As can be seen in the lower section, however, it is found that variations in the output voltage Vout at each of the times t1, t2, t3 are significantly smaller than those of the other first comparative example and second comparative example, and the adverse effect of the noise component is suppressed to a minimum.

The above is summarized as follows.

(1) In the closed-loop current sensor of this embodiment, the first and second comparative examples, and the like, the primary conductor 106 and the secondary winding 118 are in a state of being coupled with each other by the parasitic capacitance Cs through the resin case 102 and the filler. Therefore, when a high-speed switching voltage is applied to the primary conductor 106, a noise waveform is outputted as an error (malfunction) to an output signal of the sensor (the first comparative example).

(2) In order to suppress this, in the second comparative example, a technique of suppressing the error of the output signal is used by adding the shielding material 302 around the primary conductor 106 and dropping the shielding material 302 on the negative side of the direct-current power supply 122, but a very good result is not realistically obtained.

(3) In such a technique as described in the second comparative example, it is estimated that costs increase by several hundred yen per one product when the shielding material 302 is produced of a flexible sheet made of copper.

(4) In this embodiment, the capacitors C1, C2 connected to Vcc (+) and Vcc (−) respectively are connected to a connection portion of an output line of the feedback current and an inductor (secondary winding 118), thereby allowing a reduction in amount of the malfunction of the sensor output signal. Since the capacitors C1, C2 are only two chip-type capacitors as mounting products, reliable measures can be achieved at very low cost.

(5) In the verification result regarding this embodiment, as compared with the first comparative example and the second comparative example, it has been possible to confirm an about 50% reduction in amount of the malfunction.

[Set Criteria of Capacitance]

Here, there will be made reference to setting of the capacitors C1, C2 in the coupling circuit 124. In this embodiment, for example, a capacitance can be set by the following guidelines.

(1) the capacitors C1, C2 are set to have a larger capacitance than the parasitic capacitance Cs. For example, when the parasitic capacitance Cs is several hundreds of pF, a capacitance of 1000 pF which is larger than the parasitic capacitance Cs is set.

(2) The capacitors C1, C2 can be set based on an insulation distance between the primary conductor 106 and the sensor output line (output conductor) from the secondary winding 118.

However, when the capacitors C1, C2 have a large capacitance such as 0.1 μF, a drive capability on an output line of a transistor falls short, resulting in that a step response waveform cannot be appropriately outputted. Further, when the capacitors C1, C2 are connected to a winding end of the secondary winding 118, oscillation is caused by an L component of the secondary winding 118 and a capacitance component, and therefore such a connection is to be avoided.

In any case, according to the current sensor 100 of this embodiment, since the capacitors C1, C2 disposed in the coupling circuit 124 can divide the parasitic capacitance Cs and make the noise component by the high-speed switching of the primary conductor 106 escape to the positive side and the negative side of the direct-current power supply 122, the effect which the high-frequency component has on the output voltage Vout can be suppressed to a minimum.

The above-mentioned embodiment can be variously modified. For example, a shape of the magnetic core 104 may be not only the square ring shape or the circular ring shape cited in the embodiment but also another polygonal ring shape or an elliptical shape. Further, the magnetic core 104 may be produced by using a permalloy or another magnetic material (ferrite, a silicon steel plate, an iron-nickel alloy, or the like), and a toroidal structure or a multilayer structure can be employed for the magnetic core 104.

The current sensor 100 may have a degaussing circuit, and in order to eliminate residual magnetic flux (what is called to remove hysteresis) of the magnetic core 104, the degaussing circuit can remove hysteresis by using a coil for degaussing which is wound in addition to the above-described secondary winding 118.

Besides, the structure of the current sensor 100 or a part thereof cited with the illustration is only a preferred example, and various kinds of elements may be added to the basic structure, or a part of the elements may be replaced.

What is claimed is:

1. A current sensor comprising:
    a magnetic core which focuses a magnetic field generated by continuity of a current to be sensed;
    a magnetic sensing element which outputs a sensing signal according to an intensity of the magnetic field focused by the magnetic core;
    a magnetic balance circuit which applies a feedback current to a winding provided around the magnetic core based on the sensing signal from the magnetic sensing element and generates a magnet field in an opposite direction to the magnetic field generated by continuity of the current to be sensed to balance each other; and
    a coupling circuit which couples supply paths of a power supply to the magnetic balance circuit and an application path of a feedback current to the winding via capacitors;
    wherein the coupling circuit has the capacitors, which have a capacitance of a magnitude determined based on an insulation distance between a primary conductor which conducts the current to be sensed and the winding.

2. The current sensor according to claim 1, wherein the coupling circuit induces an output destination of a noise component generated in the winding due to a high-frequency component of the current to be sensed to the supply paths.

3. A current sensor comprising:
    a magnetic core which focuses a magnetic field generated by continuity of a current to be sensed;

a magnetic sensing element which outputs a sensing signal according to an intensity of the magnetic field focused by the magnetic core;

a magnetic balance circuit which applies a feedback current to a winding provided around the magnetic core based on the sensing signal from the magnetic sensing element and generates a magnet field in an opposite direction to the magnetic field generated by continuity of the current to be sensed to balance each other; and a coupling circuit which couples supply paths of a power supply to the magnetic balance circuit and an application path of a feedback current to the winding via capacitors;

wherein the coupling circuit has the capacitors, which have a larger capacitance than a capacitance present between a primary conductor which conducts the current to be sensed and the winding, and which have a capacitance of a magnitude determined based on an insulation distance between the primary conductor and the winding.

4. The current sensor according to claim 3, wherein the coupling circuit induces an output destination of a noise component generated in the winding due to a high-frequency component of the current to be sensed to the supply paths.

* * * * *